United States Patent
Takaso

(10) Patent No.: US 8,896,339 B2
(45) Date of Patent: Nov. 25, 2014

(54) METHOD FOR TESTING SEMICONDUCTOR WAFER

(75) Inventor: Jun Takaso, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 50 days.

(21) Appl. No.: 13/602,784

(22) Filed: Sep. 4, 2012

(65) Prior Publication Data

US 2013/0234750 A1    Sep. 12, 2013

(30) Foreign Application Priority Data

Mar. 8, 2012  (JP) .................................. 2012-051884

(51) Int. Cl.
*G01R 31/02*    (2006.01)

(52) U.S. Cl.
USPC ............. 324/762.05; 324/158 R; 324/754.01; 324/754.07; 324/754.03

(58) Field of Classification Search
CPC ....... H05K 1/00; H05K 3/00; G01R 2019/00; G01R 1/00; H01L 21/00
USPC ............. 324/754.08, 158 R, 754.01, 754.07, 324/754.03, 750.3
See application file for complete search history.

(56) References Cited

U.S. PATENT DOCUMENTS

| | | | |
|---|---|---|---|
| 5,239,191 A | 8/1993 | Sakumoto et al. | |
| 5,523,252 A * | 6/1996 | Saito | ................ 438/18 |
| 6,262,587 B1 * | 7/2001 | Whetsel | ..................... 324/750.3 |
| 6,577,148 B1 * | 6/2003 | DeHaven et al. | ........ 324/762.05 |
| 6,621,285 B1 * | 9/2003 | Yatsu | ......................... 324/762.05 |
| 7,190,593 B2 * | 3/2007 | Aiki et al. | ..................... 361/767 |
| 7,365,555 B2 * | 4/2008 | Noda | .......................... 324/750.3 |
| 2001/0052787 A1 * | 12/2001 | Whetsel | ......................... 324/765 |
| 2002/0145442 A1 * | 10/2002 | Kinoshita | ..................... 324/765 |
| 2003/0160626 A1 * | 8/2003 | Maruyama et al. | ............ 324/754 |
| 2004/0017217 A1 * | 1/2004 | Ryu et al. | ....................... 324/763 |

FOREIGN PATENT DOCUMENTS

| | | |
|---|---|---|
| JP | 3-214638 A | 9/1991 |
| JP | 5-121502 A | 5/1993 |

* cited by examiner

*Primary Examiner* — Huy Q Phan
*Assistant Examiner* — Temilade S Rhodes-Vivour
(74) *Attorney, Agent, or Firm* — Leydig, Voit & Mayer, Ltd.

(57) ABSTRACT

A semiconductor wafer includes semiconductor chips divided by a dicing line, one of the semiconductor chips including terminals of an identical potential; a wiring located on the dicing line, and electrically connecting the terminals to each other; and a pad electrically connected through the wiring to the terminals, wherein the pad is located entirely on the semiconductor chip and is not present on the dicing line.

2 Claims, 2 Drawing Sheets

METHOD FOR TESTING SEMICONDUCTOR WAFER

BACKGROUND OF THE INVENTION

1. Field of the Invention

The present invention relates to a semiconductor wafer including a plurality of semiconductor chips divided by a dicing line, and a method for testing the same.

2. Background Art

A semiconductor wafer wherein a plurality of terminals contained in one of a plurality of semiconductor chips are connected by wirings on a dicing line, and pads for testing are provided on the dicing line has been proposed (for example, refer to Japanese Patent Application Laid-Open No. 3-214638). In this case, the same potentials can be simultaneously applied to a plurality of terminals by contacting a probe to one pad for testing. Thereby, simultaneous measurements can be feasible, and the wafer measuring time can be shortened.

SUMMARY OF THE INVENTION

In conventional semiconductor wafers, however, since pads for testing were provided on a dicing line, the dicing line had to be thick.

In order to solve the above-described problems, the object of the present invention is to achieve a semiconductor wafer that can shorten the wafer measuring time without thickening the dicing line, and a method for measuring the same.

According to the present invention, a semiconductor wafer includes: a plurality of semiconductor chips divided by a dicing line, one of the plurality of semiconductor chips including a plurality of terminals of an identical potential; a wiring passing through the dicing line, and connecting the plurality of terminals to each other; and a pad connected to the plurality of terminals, wherein the pad is provided on the semiconductor chip and is not present on the dicing line.

The present invention makes it possible to shorten the wafer measuring time without thickening the dicing line.

Other and further objects, features and advantages of the invention will appear more fully from the following description.

DETAILED DESCRIPTION OF THE PREFERRED EMBODIMENTS

Figure 1:
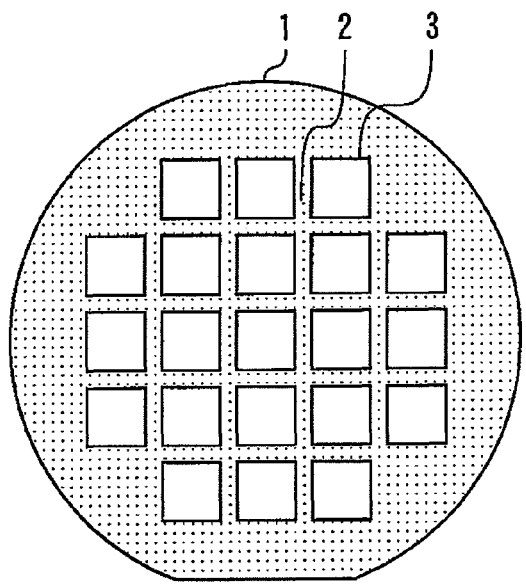
FIG. 1 is a top view showing a semiconductor wafer according to an embodiment of the present invention.

FIG. 1 is a top view showing a semiconductor wafer according to an embodiment of the present invention. On the semiconductor wafer 1, a plurality of semiconductor chips 3 are divided by a dicing line 2.

Figure 2:
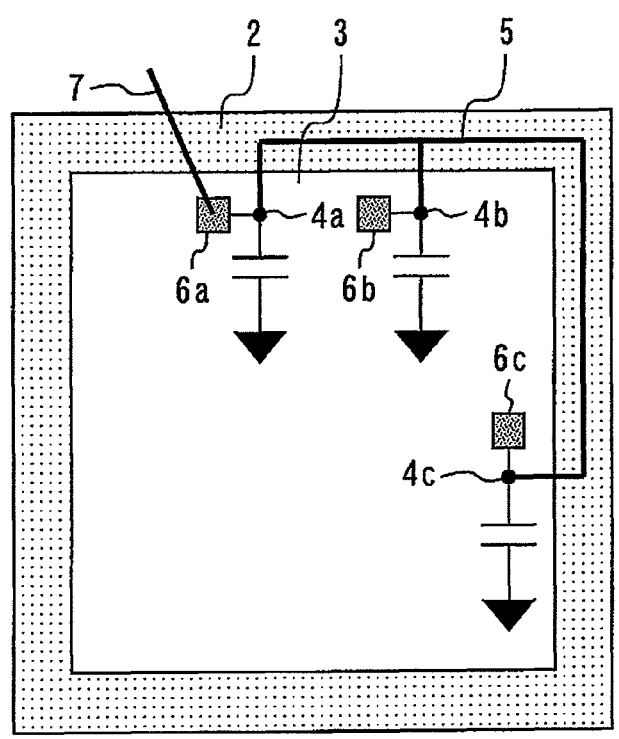
FIG. 2 is an enlarged top view showing the semiconductor wafer and a circuit diagram according to the embodiment of the present invention.

FIG. 2 is an enlarged top view showing the semiconductor wafer and a circuit diagram according to the embodiment of the present invention. A semiconductor chip 3 includes a plurality of terminals 4a, 4b, and 4c of an identical potential. A wiring 5 passes through the dicing line 2, and connects the plurality of terminals 4a, 4b, and 4c to each other. Pads 6a, 6b, and 6c are connected to the terminals 4a, 4b, and 4c, respectively. The pads 6a, 6b, and 6c are provided on the semiconductor chip 3 and are not present on the dicing line 2.

Next, a method for testing the above-described semiconductor wafer will be explained. The semiconductor chip 3 is tested by simultaneously applying an identical potential to a plurality of terminals 4a, 4b, and 4c by contacting the probe 7 to a pad 6a, via a wiring 5. Thereby, the simultaneous measurement of the terminals 4a, 4b, and 4c becomes feasible, and the time for measuring the wafer can be shortened (in the present embodiment, the number of measurements can be shortened from three to one).

In addition, the pads 6a, 6b, and 6c are provided on the semiconductor chip 3, and are not present on the dicing line 2. Therefore, it is unnecessary to thicken the dicing line 2. Furthermore, since the wiring 5 is removed by dicing after the wafer test, the wiring 5 does not affect the semiconductor chip 3. Additionally, since the layout is closed by a single chip, it is not necessary to change the entire layout for a plurality of semiconductor chips 3.

Figure 3:
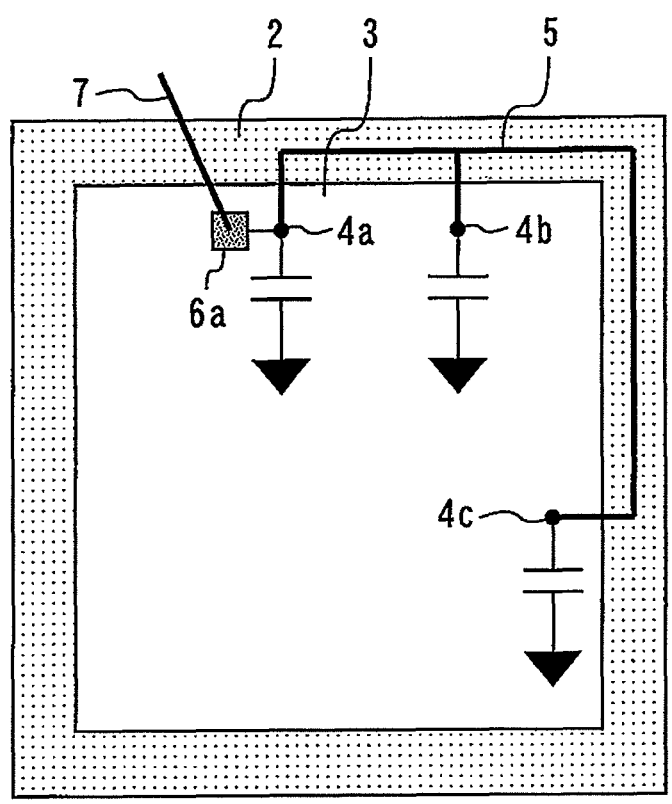
FIG. 3 is an enlarged top view showing a modified example of the semiconductor wafer and a circuit diagram according to the embodiment of the present invention.

FIG. 3 is an enlarged top view showing a modified example of the semiconductor wafer and a circuit diagram according to the embodiment of the present invention. Since the terminals 4b and 4c are connected to the pad 6a via wiring 5, the pads 6b and 6c are omitted in the modified example. Thereby, the layout of the pads 6b and 6c becomes unnecessary, the layout area can be reduced, and the cost can be lowered. In addition, since two probes for the pads 6b and 6c used for the wafer test can be eliminated, the costs for the probe cards can also be lowered.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2012-051884, filed on Mar. 8, 2012, including specification, claims, drawings, and summary, on which the Convention priority of the present application is based, is incorporated herein by reference in its entirety.

What is claimed is:

1. A method for testing a semiconductor wafer, wherein the semiconductor wafer comprises:
    a plurality of semiconductor chips within the semiconductor wafer and respectively separated from each other by a dicing line, wherein a first semiconductor chip of the plurality of semiconductor chips includes a plurality of terminals;
    a first wiring located partially on the dicing line and partially on the first semiconductor chip, wherein the first wiring electrically connects the plurality of terminals to each other so that all of the terminals have the same potential; and
    a plurality of pads, wherein
        each pad is electrically connected by a respective second wiring to a respective terminal,
        each of the pads is located entirely on the first semiconductor chip, and
        none of the pads is located on the dicing line: and
    the method comprises simultaneously applying an identical potential to the plurality of terminals by contacting a probe to only one of the pads of the plurality of pads.

2. A method for testing a semiconductor wafer, wherein the semiconductor wafer comprises:
    a plurality of semiconductor chips within the semiconductor wafer and respectively separated from each other by a dicing line, wherein a first semiconductor chip of the plurality of semiconductor chips includes a plurality of terminals;

a first wiring located partially on the dicing line and partially on the first semiconductor chip, wherein the first wiring electrically connects the plurality of terminals to each other so that all of the terminals have the same potential; and a single pad, wherein the single pad is electrically connected by a second wiring to one of the terminals of the plurality of terminals, and the single pad is located entirely on the first semiconductor chip and not on any part of the dicing line; and the method comprises simultaneously applying an identical potential to the plurality of terminals by contacting a probe to the single pad.

* * * * *